(12) United States Patent
Broughton

(10) Patent No.: US 9,562,828 B2
(45) Date of Patent: Feb. 7, 2017

(54) ENGINE HEALTH MONITORING

(71) Applicant: ROLLS-ROYCE PLC, London (GB)

(72) Inventor: Paul Broughton, Leicester (GB)

(73) Assignee: ROLLS-ROYCE PLC, London (GB)

(*) Notice: Subject to any disclaimer, the term of this patent is extended or adjusted under 35 U.S.C. 154(b) by 196 days.

(21) Appl. No.: 14/260,891

(22) Filed: Apr. 24, 2014

(65) Prior Publication Data

US 2014/0326058 A1 Nov. 6, 2014

(30) Foreign Application Priority Data

May 3, 2013 (GB) .................................... 1308034.6

(51) Int. Cl.
*G01M 15/14* (2006.01)
*F01D 21/00* (2006.01)
*F02C 7/32* (2006.01)
*G01R 27/02* (2006.01)

(52) U.S. Cl.
CPC ............ *G01M 15/14* (2013.01); *F01D 21/003* (2013.01); *F02C 7/32* (2013.01); *G01R 27/02* (2013.01); *F05D 2270/808* (2013.01); *Y02T 50/672* (2013.01)

(58) Field of Classification Search
CPC ...... G01L 1/2287; F01D 21/003; F01D 17/02; F05D 2270/808; F05D 2300/603; B29K 2105/167; B82Y 30/00
USPC ....................................................... 73/112.01
See application file for complete search history.

(56) References Cited

U.S. PATENT DOCUMENTS

| | | | |
|---|---|---|---|
| 5,174,110 A | 12/1992 | Duesler et al. | |
| 6,963,157 B2* | 11/2005 | Sato ........................ | B22F 1/004 310/367 |
| 8,128,030 B2* | 3/2012 | Dannenberg .............. | B64C 1/12 244/119 |
| 2004/0188780 A1 | 9/2004 | Kurtz | |
| 2005/0257956 A1* | 11/2005 | Marshall ............. | B29C 35/0272 174/260 |

(Continued)

FOREIGN PATENT DOCUMENTS

| EP | 1 852 296 A1 | 11/2007 |
|---|---|---|
| EP | 2 279 852 A1 | 2/2011 |

(Continued)

OTHER PUBLICATIONS

Oct. 6, 2014 Search Report issued in European Application No. 14 16 2601.

(Continued)

*Primary Examiner* — Freddie Kirkland, III
(74) *Attorney, Agent, or Firm* — Oliff PLC

(57) ABSTRACT

A vehicle is provided that has a rigid dressing raft 200. The rigid dressing raft 200 provides a part of a fluid and/or electrical system to the vehicle. The rigid dressing raft comprises elongate fibers 232, which may provide strength to the raft. The fibers 232 are electrically conductive, and a voltage source may be applied to at least one of the fibers. The fiber 232 may form a part of an electrical measurement circuit 400, such as a wheatstone bridge, which may be used to determine the electrical resistance of the fiber 232. The electrical resistance of the fiber 232 may then be used to determine the temperature and/or stress/strain of the raft 200.

16 Claims, 6 Drawing Sheets

(56) References Cited

U.S. PATENT DOCUMENTS

| | | | | |
|---|---|---|---|---|
| 2006/0253942 A1* | 11/2006 | Barrera | ................ | B82Y 15/00 |
| | | | | 73/661 |
| 2007/0034975 A1* | 2/2007 | Kurtz | .................... | B82Y 10/00 |
| | | | | 257/415 |
| 2007/0235209 A1* | 10/2007 | Bailey | ................ | H01B 7/0838 |
| | | | | 174/116 |
| 2008/0185478 A1* | 8/2008 | Dannenberg | .............. | B64C 1/12 |
| | | | | 244/119 |
| 2013/0323054 A1* | 12/2013 | Kubel | .................... | F01D 17/02 |
| | | | | 416/1 |
| 2014/0326058 A1* | 11/2014 | Broughton | ............ | G01M 15/14 |
| | | | | 73/112.01 |
| 2014/0326715 A1* | 11/2014 | Zizzo | ....................... | C08K 3/04 |
| | | | | 219/553 |
| 2014/0327299 A1* | 11/2014 | Broughton | ................ | F02C 7/00 |
| | | | | 307/9.1 |

FOREIGN PATENT DOCUMENTS

| | | |
|---|---|---|
| EP | 2 607 659 A2 | 6/2013 |
| GB | 2497807 A | 6/2013 |
| WO | 2004/065926 A1 | 8/2004 |

OTHER PUBLICATIONS

Search Report issued in British Patent Application No. 1308034.6 dated Oct. 30, 2013.

\* cited by examiner

ENGINE HEALTH MONITORING

CROSS-REFERENCE TO RELATED APPLICATIONS

This application is based upon and claims the benefit of priority from British Patent Application Number 1308034.6 filed 3 May 2013, the entire contents of which are incorporated by reference

BACKGROUND OF THE INVENTION

1. Field of the Disclosure

The invention relates to an assembly for monitoring parameters of a gas turbine engine, in particular using the resistance of a carbon fibre raft mounted to the engine.

2. Description of the Related Art

A typical gas turbine engine has a substantial number of electrical components which serve, for example, to sense operating parameters of the engine and/or to control actuators which operate devices in the engine. Such devices may, for example, control fuel flow, variable vanes and air bleed valves. The actuators may themselves be electrically powered, although some may be pneumatically or hydraulically powered, but controlled by electrical signals.

Electrical power, and signals to and from the individual electrical components, is commonly transmitted along conductors. Conventionally, such conductors may be in the form of wires and/or cables which are assembled together in a harness. In such a conventional harness, each wire may be surrounded by an insulating sleeve, which may be braided or have a braided cover.

By way of example, FIG. 1 of the accompanying drawings shows a typical gas turbine engine including two conventional wiring harnesses 102, 104, each provided with a respective connector component 106, 108 for connection to circuitry, which may be for example accommodated within the airframe of an aircraft in which the engine is installed.

The harnesses 102, 104 are assembled from individual wires and cables which are held together over at least part of their lengths by suitable sleeving and/or braiding. Individual wires and cables, for example those indicated at 110, emerge from the sleeving or braiding to terminate at plug or socket connector components 112 for cooperation with complementary socket or plug connector components 114 on, or connected to, the respective electrical components.

Each conventional harness 102, 104 comprises a multitude of insulated wires and cables. This makes the conventional harness itself bulky, heavy and difficult to manipulate. The conventional harnesses occupy significant space within a gas turbine engine (for example within the nacelle of a gas turbine engine), and thus may compromise the design of the aircraft, for example the size and/or weight and/or shape of the nacelle.

Conventional harnesses comprise a large number of components, including various individual wires and/or bundles of wires, supporting components (such as brackets or cables) and electrical and/or mechanical connectors. This can make the assembly process complicated (and thus susceptible to errors) and/or time consuming. Disassembly of the conventional harnesses (for example removal of the conventional harnesses from a gas turbine engine during maintenance) may also be complicated and/or time consuming. Thus, in many maintenance (or repair or overhaul) procedures on a gas turbine engine, removal and subsequent refitting of the conventional electrical harness may account for a very significant portion of the operation time and/or account for a significant proportion of the potential assembly errors.

The electrical conductors in the conventional harnesses may be susceptible to mechanical damage. For example, mechanical damage may occur during installation (for example through accidental piercing of the protective sleeves/braiding) and/or during service (for example due to vibration). In order to reduce the likelihood of damage to the conductors in a conventional harness, the protective sleeves/braiding may need to be further reinforced, adding still further weight and reducing the ease with which they can be manipulated. Similarly, the exposed electrical connectors used to connect one conductor to another conductor or conductors to electrical units may be susceptible to damage and/or may add significant weight to the engine.

In addition to the electrical systems, a gas turbine engine comprises various other systems that are critical to and necessary for the functioning of the engine. Such systems include, for example, fluid systems including gas and liquid systems.

In general, the components of the various support systems (such as electrical and/or fluid systems) that are provided to the engine are referred to as engine dressings. At least some of the engine dressings are conventionally provided on casings of a gas turbine engine, such as a fan case. Conventional arrangements of engine dressings, in which the various systems and components thereof are individually attached to the engine in a number of different manual operations are time consuming, susceptible to errors, and may result in at least some parts of the dressing being damaged.

A gas turbine engine is also provided with various dedicated systems/components that measure engine parameters, for example during operation. For example, the gas turbine engine may comprise temperature sensors (such as thermocouples), fire detectors (such as elongate elements, for example pressurized tubes or electrical capacitors, that run over the engine), strain gauges and vibration detectors. These monitoring systems may be used to measure performance of the engine and its components and/or to detect wear and/or failure. However, the monitoring systems further add to the complexity, part-count, weight, and build-time of the engine.

OBJECTS AND SUMMARY

It is desirable to address at least one of the drawbacks associated with conventional engine dressings and monitoring systems. For example, it is desirable to reduce the weight and/or complexity (including part count and build time) associated with engine dressings and monitoring systems, and/or to improve their reliability.

According to an aspect, there is provided a rigid composite structure (such as a rigid dressing raft) for a vehicle, comprising:

a rigid material;

at least a part of a component or system of the gas turbine engine provided to (for example mounted on and/or embedded in) the rigid material; and at least one electrically conductive elongate fibre element that is integral to the rigid dressing raft, wherein:

the electrically conductive elongate fibre element is connectable to an electrical measurement circuit (for example using electrodes), such that, in use:

the electrical measurement circuit supplies an electrical current to the elongate fibre element, thereby determining the resistance of the elongate fibre element, the determined electrical resistance being representative of at least one property of the rigid dressing raft.

There is also provided a rigid dressing raft as described above and elsewhere herein for a gas turbine engine. Thus, the vehicle may comprise a gas turbine engine, and the rigid dressing raft may be for the gas turbine engine.

Accordingly, the rigid dressing raft (which may be referred to simply as a raft, or a rigid composite structure) can be used to provide at least a part of one or more components/systems (or dressings, which may be referred to as auxiliary components or systems) of a gas turbine engine (or vehicle), whilst also being used to measure at least one property of the raft, which may represent a property of the engine to which it is fitted. Such a property may be, for example, any property whose value affects the resistance of the elongate fibre element, such as one or more of the temperature, stress and vibration level of the raft and/or of a part of an engine to which the raft may be fitted.

The rigid dressing raft may provide at least a part of an electrical system and/or a fluid system to the vehicle, for example. Providing such systems as part of a rigid raft may have a number of advantages, as discussed elsewhere herein. Multiple components/systems (or parts thereof) can be provided using a single raft, thereby simplifying the provision of engine dressing, and making the dressings more robust. At least a part of both a fluid system and an electrical system may be provided to the rigid material.

The conductive elongate fibre element may comprise carbon. The conductive elongate fibre element may be non-metallic. The conductive elongate fibre element may be continuous.

The rigid material may be a carbon fibre composite material. The electrically conductive fibre element may be one or more carbon fibre strands. For example, the electrically conductive fibre element may be a single continuous carbon fibre strand, or a bundle of continuous carbon fibre strands. Such carbon fibre strands may thus provide strength to the rigid dressing raft, as well as being used to conduct electricity in order to monitor properties of the raft.

At least one electrically conductive fibre element may be a carbon nano-tube.

The rigid dressing raft may have a secondary (for example a metallic) conductor embedded in the rigid material. The secondary conductor may have a resistance that is substantially lower than the electrically conductive elongate fibre element.

The metallic (secondary) conductor may be arranged for connection to the electrical measurement circuit, such that, in use, the metallic conductor is used to supply electrical current to the elongate fibre element.

The rigid dressing raft may comprise a plurality of embedded metallic conductors. The embedded metallic conductors may form at least a part of one or more electrical systems. Such electrical systems may be electrical systems other than the electrical measurement circuit.

The rigid dressing raft may thus comprise at least a part of an electrical system. For example, the rigid dressing raft may comprise at least a part of the conductors that would conventionally form part of an electrical harness of a gas turbine engine.

Such a rigid dressing raft may be referred to as an electrical raft, a rigid electrical raft or an electrical harness raft.

A rigid dressing raft may comprise an electrical unit, or ECU, such as an Electronic Engine Controller (EEC) and/or an Engine Health Monitoring Unit (EMU). Such an EMU may be connected to the electrically conductive elongate fibre element. Thus, a surface of a rigid dressing raft may be used as a mounting surface for gas turbine engine components/systems, such as ancillary/auxiliary components/systems.

At least one embedded conductor may be provided in the form of a flexible printed circuit. This may be a particularly convenient way in which to provide electrical conductors to a raft, for example a particularly convenient way of providing a plurality of embedded conductors.

Additionally or alternatively, the rigid dressing raft may provide/comprise at least a part of a fluid system. For example, the rigid dressing raft may comprise at least one fluid passage mounted on or at least partially embedded therein. The at least one fluid passage may form a part of a fluid system of the gas turbine engine. By way of example, such a fluid system may be for a gas (for example pneumatic or cooling gas/air) and/or liquid (for example a fuel, hydraulic and/or lubricant liquid).

According to an aspect, there is provided a raft monitoring system for a gas turbine engine comprising a rigid dressing raft as described above and elsewhere herein. The raft monitoring system also comprises an electrical measurement circuit. The electrical measurement circuit may be electrically connected to the elongate fibre element so as to supply an electrical current thereto. The electrical measurement circuit may thus be used to measure the resistance of the elongate fibre element. The electrical measurement circuit may be provided to the raft (for example it may be at least partially embedded in the raft), or it may be provided separately from the raft.

The electrical measurement circuit may comprise a wheatstone bridge arrangement. In such a wheatstone bridge arrangement, the elongate fibre element may form the unknown resistor element to be determined.

Such a wheatstone bridge arrangement may be an accurate and convenient way in which to determine the resistance of the elongate fibre element. Such a wheatstone bridge may be arranged in a conventional manner, with a power supply (which may be A.C. and/or D.C.), three resistors of known resistance, the elongate fibre element forming a fourth resistor of unknown resistance, with two of the known resistors arranged in parallel with the other two resistors, and a voltmeter attached at one end between the two resistors in one parallel branch, and at the other end between the two resistors in the other parallel branch.

The raft monitoring system may further comprise a raft parameter determination system arranged to determine the value of a parameter (or property) of the raft from the determined resistance of the elongate fibre element. Such a raft parameter determination system may, for example, be a database or software comprising the correlation between the resistance of the elongate fibre and a given parameter.

Such a raft parameter determination system may be arranged to determine the value of at least one of the temperature, stress and vibration level of the raft.

For example, the stress of the raft may be measured as a static change in resistance, as may the temperature of the raft. The vibration level of the raft may be measured as an AC change in resistance. Such vibration may result in, for example, stretching, compression, bending or twisting of the raft.

A raft monitoring system may further comprise an additional system for determining at least one parameter of the engine. The or each parameter determined by the additional system may be used to calibrate the parameter determined by the raft parameter determination system. For example, if the temperature of the raft is to be measured, then resistance changes in the elongate fibre element may need to be calibrated out of the reading, and vice versa. Such an additional system may be a conventional measurement system (such as a thermocouple or a strain gauge), or may be a further raft monitoring system, for example placed elsewhere in the engine. Alternatively, some parameters of the engine may be assumed, for example from the engine operating condition, allowing other parameters to be measured using the raft monitoring system.

The parameters of the raft may be indicative of the parameters of the engine. Purely by way of example, the temperature or vibration of the raft may be indicative of the temperature or vibration of the part of the engine where the raft is located and/or the part of the engine to which it is attached. Thus, the raft monitoring system may be used to monitor parameters of the engine itself, and so may be, or may be a part of, an engine health monitoring system.

According to an aspect, there is provided a gas turbine engine comprising a rigid dressing raft and/or a raft monitoring system as described above and elsewhere herein. The rigid material of the rigid raft may be shaped to conform to a part of the gas turbine engine.

For example, the rigid dressing raft may be shape to conform to (and/or may be provided to) a casing of a gas turbine engine, for example a fan casing or a core casing of a gas turbine engine. As such, the rigid dressing raft may replace some or all of the conventional dressings that would be provided to such casings of a gas turbine engine.

Indeed, a rigid dressing raft may be provided in any suitable location/position of a gas turbine engine. Thus, by way of further example, the gas turbine engine may comprise a bypass flow duct formed between an engine core and an engine fan casing (the gas turbine engine may be a turbofan engine, for example); and the raft may form at least a part of a radially extending splitter (which may be referred to as a bifurcation) that extends across the bypass flow duct. In this way, a raft (which may be referred to as a splitter raft) may provide an electrical and/or fluid connection between a fan casing and an engine core.

According to an aspect, there is provided a method of measuring a parameter of a rigid dressing raft. The method comprises providing a rigid dressing raft, the rigid dressing raft having a rigid material, at least a part of a component or system provided to the rigid material, and at least one electrically conductive elongate fibre element that is integral to the rigid dressing raft. The method also comprises passing an electrical current through the electrically conductive fibre element so as to thereby measure its resistance (for example using any one of the apparatus/methods described herein). The method also comprises using the measured resistance to determine the value of a parameter of the rigid dressing raft (for example using any of the methods/apparatus described herein).

Any suitable material may be used for the rigid material of the rigid dressing raft. For example, the rigid material may be a rigid composite material, such as an organic matrix composite. Such a rigid composite material may be particularly stiff and/or lightweight. Thus, a rigid composite raft may be used that has suitable mechanical properties, whilst being thin and lightweight, for example compared with some other materials. The rigid composite material may comprise any suitable combination of resin and fibre as desired for a particular application. For example, any of the resins and/or fibres described herein may be used to produce a rigid composite material for the rigid dressing raft. Any suitable fibres may be used, for example carbon fibres, glass fibres, aramid fibres, and/or para-aramid fibres. The fibres may be of any type, such as woven and/or chopped. Any suitable resin may be used, for example epoxy, BMI (bismaleimide), PEEK (polyetheretherketone), PTFE (polytetraflouroethylene), PAEK (polyaryletherketone), polyurethane, and/or polyamides (such as nylon).

As mentioned elsewhere herein, any component, system or part thereof (for example anything that may be considered an engine dressing) may be provided to or as part of the rigid dressing raft, for example at least a part of a fluid system and/or an electrical system.

As mentioned above, in general the use of one or more rigid dressing rafts (for example electrical rafts) may significantly reduce build time and/or the part count of an engine compared with the use of conventional dressings. The number and/or complexity of the operations required to assemble an engine (for example to assemble/install the electrical system (or network) and/or other peripheral components, which may be referred to in general as engine dressing) may be reduced. For example, rather than having to install/assemble a great number of wires and/or wiring looms and/or fluid pipes/passages together on the engine installation, it may only be necessary to attach a relatively small number of rigid dressing rafts (such as electrical rafts), which themselves may be straightforward to handle, position, secure and connect. Thus, use of rigid dressing rafts (which may in general be referred to simply as rafts) in a gas turbine installation may reduce assembly time and/or reduce the possibility of errors occurring during assembly.

Use of rigid dressing rafts (for example electrical rafts) may provide significant advantages during maintenance, such as repair and overhaul. As discussed above, the rafts may be particularly quick and straightforward to assemble. The same advantages discussed above in relation to assembly apply to disassembly/removal from the gas turbine engine. Thus, any repair/overhaul that requires removal of at least a part of a system (such as an electrical and/or fluid system) may be simplified and/or speeded up through use of rafts. Use of rafts may allow maintenance procedures to be advantageously adapted. For example, some maintenance procedures may only require access to a certain portion of the gas turbine engine that only requires a part of the harness to be removed. It may be difficult and/or time consuming, or not even possible, to only remove the required part of a conventional harness from a gas turbine engine. However, it may be relatively straightforward to only remove the raft, for example by simply disconnecting it from the engine and any other rafts/components to which it is connected. Decreasing maintenance times has the advantage of, for example, reducing out-of service times (for example off-wing times for engines that are used on aircraft).

The build/assembly times may be additionally or alternatively reduced by pre-assembling and/or pre-testing individual and/or combinations of rafts and/or raft assemblies prior to engine assembly. This may allow the operation (for example the electrical and/or mechanical operation) of the rafts to be proven before installation, thereby reducing/eliminating the testing required during engine installation.

Rigid dressing rafts may be more easily packaged and/or more compact, for example than conventional dressings, such as electrical harnesses and/or pipes. The rafts can be made into a very wide range of shapes as desired. This may be achieved, for example, by manufacturing the rafts using a mould conforming to the desired shape. As such, each raft may be shaped, for example, to turn through a tighter corner (or smaller bend radius) than a conventional harness or pipe. The rafts may thus provide a particularly compact solution for transferring electrical signals and/or fluids around a gas turbine engine. The rafts may be readily shaped to conform to neighbouring components/regions of a gas turbine engine, for example components/regions to which the particular raft assembly is attached, such as a fan casing or a core casing.

Where the rigid dressing raft is an electrical raft, this may represent a particularly lightweight solution for transferring electrical signals around an engine. For example, an electrical raft may be lighter, for example significantly lighter, than a conventional harness required to transmit a given number of electrical signals. A plurality of conductors may be embedded in a single electrical raft, whereas in a conventional arrangement a large number of heavy, bulky wires, usually with insulating sleeves, would be required. The reduced weight may be particularly advantageous, for example, when used on gas turbine engines on aircraft.

Such electrical raft(s) (i.e. rigid dressing rafts comprising electrical conductors) may provide improved protection to the electrical conductors during manufacture/assembly of the raft/gas turbine installation, and/or during service/operation/maintenance of the gas turbine engine. This may result in lower maintenance costs, for example due to fewer damaged components requiring replacement/repair and/or due to the possibility of extending time intervals (or service intervals) between inspecting the electrical system, for example compared with a system using only conventional harnesses.

In any example of electrical raft (which, or course, is a type of rigid dressing raft), at least one of the electrical conductors embedded in the electrical raft may be an electrically conductive wire. The or each electrically conductive wire may be surrounded by an electrically insulating sleeve.

As mentioned elsewhere herein, at least some (for example a plurality) of the electrical conductors may be provided in a flexible printed circuit (FPC). Thus, at least some electrical conductors may be provided as electrically conductive tracks in a flexible substrate. The flexible printed circuit may be flexible before being embedded in the rigid material.

Providing the electrical conductors as tracks in a flexible printed circuit may allow the size of the resulting electrical raft to be reduced further and/or substantially minimized. For example, many different electrical conductors may be laid into a flexible printed circuit in close proximity, thereby providing a compact structure. The flexible substrate of a single flexible printed circuit may provide electrical and/or mechanical protection/isolation to a large number of electrical conductors.

Any given electrical raft may be provided with one or more electrical wires embedded therein (which may be sheathed) and/or one or more flexible printed circuits embedded therein. As such, a given electrical raft may have wires and flexible printed circuits laid therein.

It will be appreciated that the embedded components in the rigid dressing raft, such as electrical conductors (whether they are provided as embedded electrical wires or as conductive tracks in a flexible printed circuit embedded in the rigid material) and/or fluid pipes may be described as being fixed in position by the rigid material, for example relative to the rest of the electrical harness raft. It will also be appreciated that the embedded components may be said to be surrounded by the rigid material and/or buried in the rigid material and/or integral with (or integrated into) the rigid material.

An electrical raft may comprise one or more electrical connectors or sockets, which may be electrically connected to at least one embedded electrical conductor. The electrical connector or socket may allow electrical connection of the electrical raft to other electrical components, for example to other electrical rafts (either directly or indirectly, via an electrical cable or lead) or to electrical units (again, either directly or indirectly, via an electrical cable or lead). Such an electrical connector or socket may take any suitable form, and may be at least partially embedded in the rigid electrical raft.

There is also provided a method of servicing a gas turbine engine comprising a rigid dressing raft as described herein. The method comprises removing the raft from a gas turbine engine; and installing a second, pre-prepared, raft onto the gas turbine engine in place of the removed raft. The second, pre-prepared raft may be of the same, or a modified specification as the removed raft.

The removed raft may, for example, be tested and/or repaired (if necessary) once removed from the gas turbine engine. The removed and optionally tested and/or repaired raft may then be used as the replacement (or second) raft during another service, which may be of the same or a different engine.

According to an aspect, there is provided a gas turbine engine comprising an assembly as described herein, in which the rigid dressing raft is an electrical raft. The electrical raft of the assembly may form a first engine installation component. The gas turbine engine may comprise a second engine installation component comprising electrical conductors. At least one flexible cable may be electrically connected between the electrical raft (or first engine installation component) and the second engine installation component. Thus, the flexible cable(s) may electrically connect electrical conductors of the electrical raft with electrical conductors of the second engine installation component.

The second engine installation component may be, for example, an ECU, such as an EMU or EEC. Additionally or alternatively, the second engine installation component may be a further electrical raft or electrical raft assembly.

The environment of a gas turbine engine during operation may be particularly severe, with, for example, high levels of vibration and/or differential expansion between components as the temperature changes through operation and as the components move relative to each other. Providing at least one flexible cable to connect an electrical raft assembly to another component may allow the electrical rafts and/or components to accommodate vibration and/or relative movement, for example of the component(s)/assemblies to which they are attached/mounted during use. For example, the flexible cable(s) (where present) used to electrically connect electrical raft assemblies to other component(s) may have sufficient length to accommodate such vibration and/or movement during use.

For example, providing separate (for example more than one) electrical raft assemblies and connecting at least some (for example at least two) of them together using at least one flexible cable may allow the electrical rafts to accommodate vibration and/or relative movement of the component(s)/assemblies to which they are attached/mounted during use.

The electrical signals transferred by the conductors in the electrical raft, and around the engine using the electrical rafts/raft assemblies may take any form. For example, the electrical signals may include, by way of non-limitative example, electrical power and/or electrical control/communication signals and/or any other type of transmission through an electrical conductor. Transmission of signals around the engine may mean transmission of signals between (to and/or from) any number of components/systems in the engine and/or components/system of a structure (such as an airframe) to which the gas turbine engine is (or is configured to be) connected/installed in. In other words, an electrical raft may be used to transfer/communicate any possible combination of electrical signals in any part of a gas turbine engine installation or a related (for example electrically and/or mechanically connected) structure/component/system.

An anti-vibration mount may be used to attach a raft to another component, thereby allowing the raft to be vibration isolated (or at least substantially vibration isolated). The raft location fixing and the support structure location fixing may be constructed and arranged to provide a degree of vibration isolation. Additionally or alternatively, additional anti-vibration mounts may be provided between the support structure and the rigid dressing raft. This may be useful, for example, where the rigid dressing raft is used to measure parameters of the engine other than vibration.

Using an anti-vibration mount to attach a raft to a gas turbine engine for example may reduce (or substantially eliminate) the amount (for example the amplitude and/or the number/range of frequencies) of vibration being passed to the raft from the gas turbine engine, for example during use. This may help to prolong the life of the raft. Furthermore, any other components that may be attached to the raft (as discussed above and elsewhere herein) may also benefit from being mounted to the gas turbine engine via the anti-vibration mounts, through being mounted on the raft. For example, the reduced vibration may help to preserve the electrical contact between an electrical raft and any electrical unit connected thereto. As such, any components (such as an electrical unit mounted to the electrical raft) that would conventionally be mounted directly to the gas turbine engine and require at least a degree of vibration isolation no longer require their own dedicated anti-vibration mount. Thus, the total number of anti-vibration mounts that are required to assemble an engine may be reduced. This may reduce the number of parts required and/or the time taken to assemble an engine or engine installation and/or reduce the total assembled weight and/or reduce the likelihood of errors occurring during assembly.

Furthermore, components that are conventionally mounted to an engine without anti-vibration mounts (for example because of the weight and/or cost penalty), but which are now mounted to a raft (for example to a mounting surface of the raft), may benefit from vibration isolation without any weight/cost/assembly time penalty. This may reduce the possibility of damage occurring to such components and/or increase their service life. Such components may include, for example, ignitor boxes (used to provide high voltage power to engine ignitors), and pressure sensors/switches, for example for fluid systems such as oil, air, fuel, pneumatics and/or hydraulics.

BRIEF DESCRIPTION OF THE DRAWINGS

The invention will now be described, by way of example only, with reference to the accompanying Figures, in which.

DETAILED DESCRIPTION OF THE PREFERRED EMBODIMENTS

Figure 1:
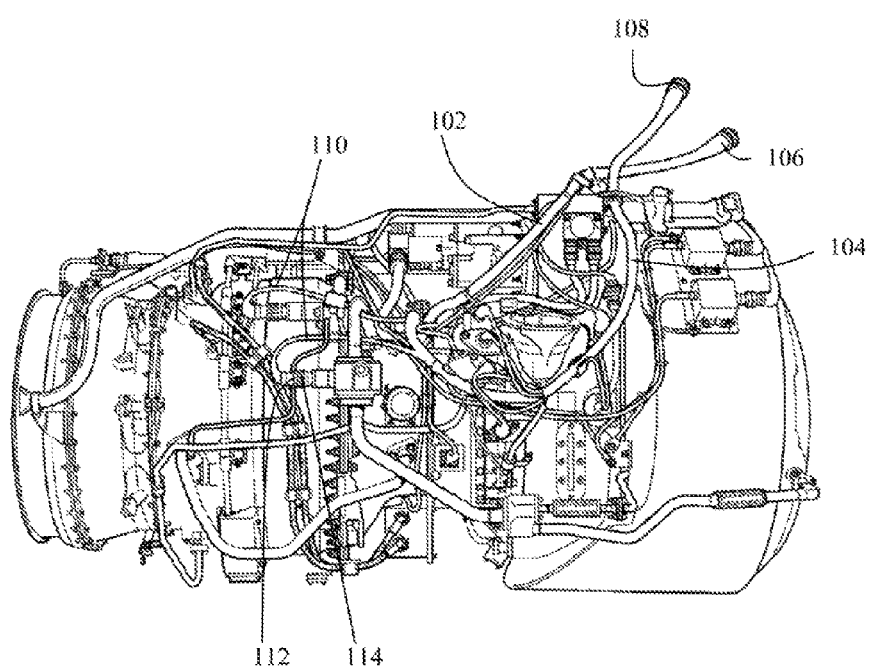
FIG. 1 shows a gas turbine engine with a conventional harness.
Figure 2:
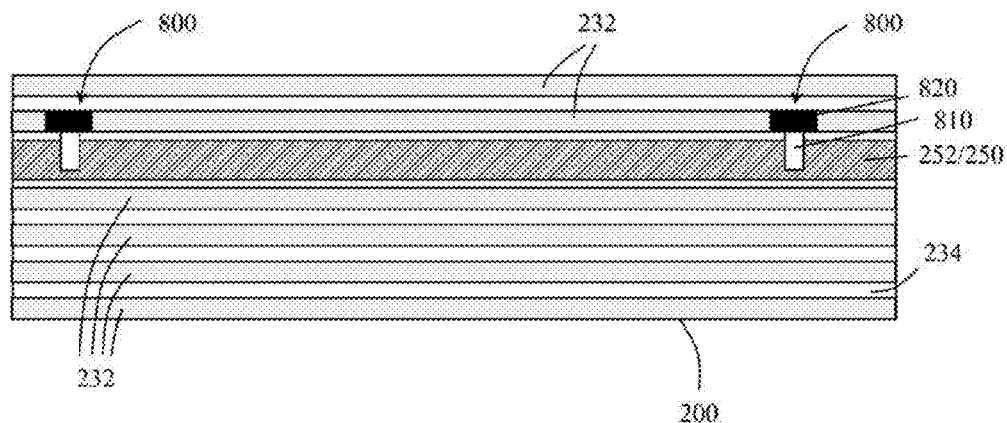
FIG. 2 shows a schematic of rigid dressing raft (or composite structure) according to an example of the present invention.

FIG. 2 shows a schematic cross section of a composite structure 200 according to the present invention. The composite structure 200 may carry at least a part of one or more systems of a vehicle (i.e. vehicle dressings), such as a fluid or electrical system of a gas turbine engine 10, and thus may be referred to as a rigid dressing raft 200.

The rigid dressing raft 200 in the example of FIG. 2 comprises a plurality of fibre elements 232 reinforcing a polymer base material 234. In FIG. 2, the fibre elements labelled 232 may represent single fibres or bundles of multiple fibres. At least some of the fibres 232 are electrically conductive, and non-metallic, such as carbon fibres.

The rigid dressing raft 200 in the FIG. 2 example has at least one electrical conductor 252 embedded therein. The electrical conductor 252 may be a part of an electrical system. For example, the rigid dressing raft 200 may be for use with a gas turbine engine 10, and the electrical conductor 252 may be a part of a gas turbine engine electrical system. As described elsewhere herein, the electrical conductor 252 may be, for example, a metallic wire or a flexible PCB 250, as in the example shown in FIG. 2. Any number of electrical conductors 252 and/or flexible PCBs 250 may be embedded in the raft 200. Thus, the raft 200 may be used to provide electrical conductors for a plurality of different circuits.

In the example shown in FIG. 2, the raft 200 comprises electrical connectors 800 which provide an electrical connection between the conductor 252 and a fibre element 232. The electrical connector 800 may take any suitable form, such as a direct connection, which may have a portion 810 connected to the conductor 252 and a portion 820 connected to the fibre element 232. The connector 800 may be embedded in rigid material of the rigid dressing raft 200.

Providing two such connectors 800 spaced apart along an elongate fibre element 232, as shown in FIG. 2, allows an electrical current to be provided to, and passed along, the elongate fibre element 232, between the two connectors 800. As such, the embedded conductor 252 may be used to provide electrical power to the fibre element 232, such that an electrical current passes through the fibre element 232. The electrical power may be provided to the embedded conductor 252 in any suitable manner, which may be through a conventional power supply, for example, which may be AC or DC.

The fibre element 232 to which the electrical power is provided may be, for example, a conventional fibre element 232 that is used to reinforce a composite raft 200. Alternatively, the fibre element 232 may be specifically designed to have electrical power provided thereto. For example, the fibre element 232 may be a carbon nanotube.

The current passing through the fibre element 232 may be a function of the resistance (or impedance) of the fibre element 232. The resistance of the fibre element 232 is a function of the state of the fibre element 232, for example in terms of the stress that the fibre element 232 is under, and/or the temperature of the fibre element 232. In this regard, for example, the resistance of a fibre element 232 (such as a carbon fibre element) may typically increase with increasing stress/strain, and may typically decrease with increasing temperature.

This means that determining the resistance of the elongate fibre element 232 allows the state (for example temperature and/or stress/strain) of the fibre element 232 to be inferred. In turn, this may allow the state (or property) of the raft 200 to be inferred and/or the state of the environment in which the raft 200 is positioned to be inferred. For example, the resistance of the fibre element 232 could thus be used to determine any one or more of stress, strain, temperature and/or vibration. Thus, the resistance of the fibre element 232 could be used to monitor such parameters during use and/or to detect failure (such as fire) through such parameters.

Due to the potential variation in resistance of the fibre element with both strain and temperature, calibration may be required in order to obtain a more accurate indication of one of the two parameters. For example, one of stress/strain or temperature of the raft 200 may be measured using another system (which may be a conventional system, such as a thermocouple or strain gauge), or may be assumed from the known operating condition of the vehicle (such as a gas turbine engine). Alternatively still, the raft 200 may be isolated from one of either temperature or strain variation, for example by using an anti-vibration mount to reduce and/or substantially eliminate changes in strain in the raft 200.

Figure 3:
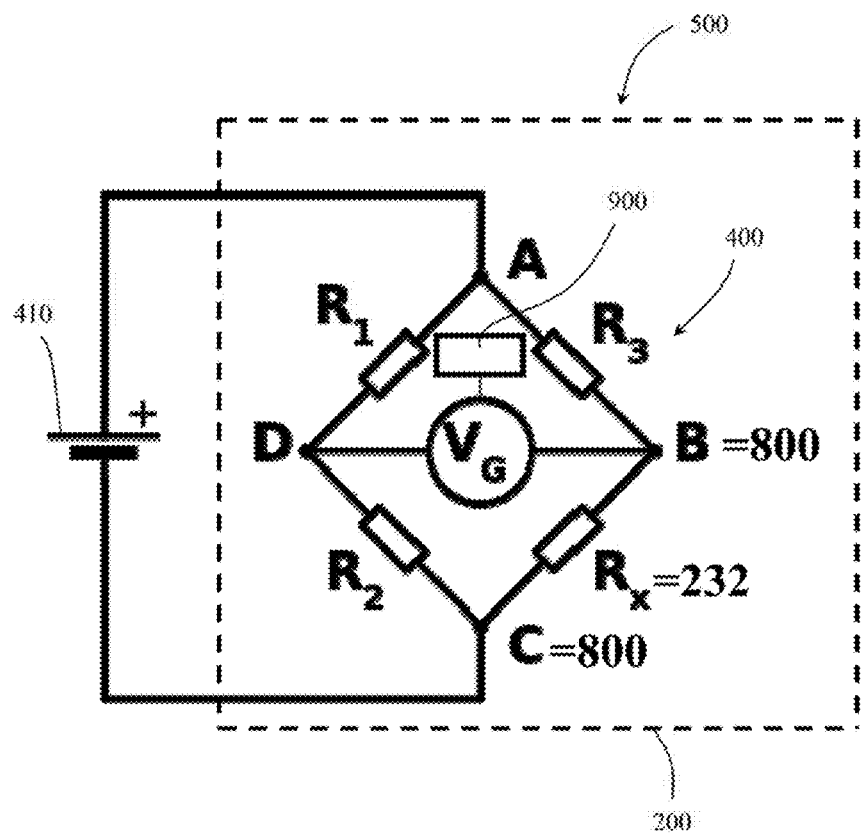
FIG. 3 shows a schematic of a raft monitoring system according to an example of the present invention.

FIG. 3 shows an example of an electrical measurement circuit 400 that could be used to determine the resistance of the fibre element 232. The circuit shown in FIG. 3 is an example of a wheatstone bridge arrangement, but it will be appreciated that other circuits could be used to determine the resistance of the fibre element 232.

As shown in FIG. 3, the elongate fibre element portion 232 between the two connectors 800 is the unknown resistor Rx in the wheatstone bridge, which also comprises three other resistors R1, R2, R3, in a conventional wheatstone bridge arrangement. The reading of the voltmeter can then be used to directly determine the unknown resistance Rx in a conventional manner, and thus the resistance of the elongate fibre element 232 between the two connectors 800 (which are represented schematically by points B and C in the wheatstone bridge of FIG. 3).

The electrical measurement circuit 400 and the rigid dressing raft 200 (or at least the elongate fibre element portion 232 thereof) may together be referred to as a raft monitoring system 500. The raft monitoring system 500 may also comprise a raft parameter determination system 900. The raft parameter determination system 900 may be used to determine the value of a parameter (or state, or property) of the elongate fibre element 232 (and thus of the raft 200) from the resistance determined by the electrical measurement circuit 400. For example, the raft parameter determination system 900 may determine the value of a parameter (such as temperature and/or stress/strain and/or vibration) directly from voltage reading from the voltmeter $V_G$, which itself is a function of the resistance of the elongate fibre element 232. The raft parameter determination system 900 may comprise software to convert the output of the electrical measurement circuit 400 into the value of a parameter. For example, the raft parameter determination system may comprise data that may be used to convert the measured resistance (or voltage) from the electrical measurement circuit 400 into a parameter value, optionally taking into account any effect from other parameters.

In FIG. 3, the dashed line surrounding the circuit 400 and the raft parameter determination system 900 represents the rigid dressing raft 200. Thus, according to this arrangement, the rigid dressing raft 200 comprises the wheatstone bridge circuit 400 and the raft parameter determination system 900, but not the power supply. However, it will be appreciated that only the elongate fibre element 232 must be included in the raft 200. The raft parameter determination system 900 and/or the electrical measurement circuit 400 and/or the power supply 410 may also be incorporated into the raft 200 itself, or may be provided separately from the raft 200.

The invention may allow the state (or parameters) of a composite raft to be monitored using components of the raft itself, including the fibres 232 and embedded conductors 252. Having the components of the monitoring system integral with (for example embedded in) the raft 200 may provide improved protection to the components, and thus they may be more reliable than conventional systems. Furthermore, the part count (and thus build time and/or weight and/or complexity) of the combined dressing (for example electrical and/or fluid system) and monitoring system may be reduced through use of such a raft 200 as described herein.

Figure 4:
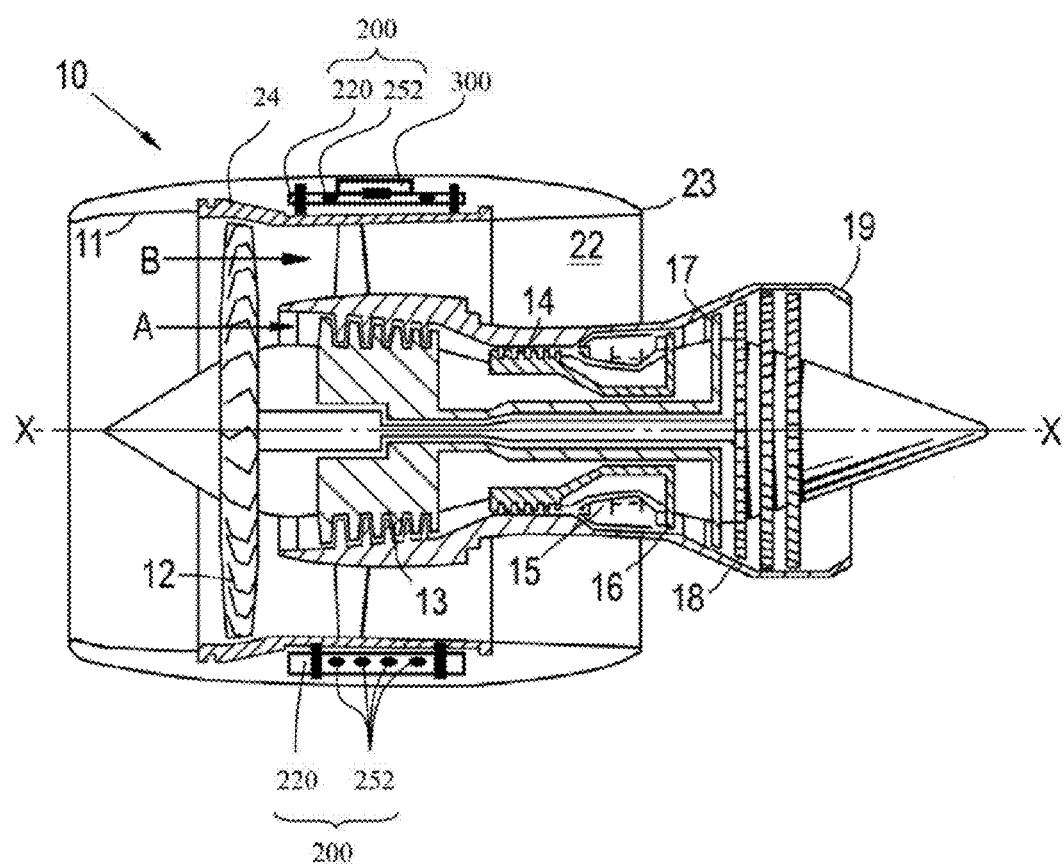
FIG. 4 shows a cross-section through a gas turbine engine having a rigid dressing raft in accordance with the present invention.

As mentioned elsewhere herein, a rigid dressing raft 200 comprising an elongate fibre element for use in determining a property of the raft 200 may be provided to a gas turbine engine, for example to provide engine dressings to a gas turbine engine. Such a gas turbine engine is illustrated in FIG. 4, which shows a ducted fan gas turbine engine generally indicated at 10 that has a principal and rotational axis X-X. The engine 10 comprises, in axial flow series, an air intake 11, a propulsive fan 12, an intermediate pressure compressor 13, a high-pressure compressor 14, combustion equipment 15, a high-pressure turbine 16, and intermediate pressure turbine 17, a low-pressure turbine 18 and a core engine exhaust nozzle 19. The engine also has a bypass duct 22 and a bypass exhaust nozzle 23.

The gas turbine engine 10 works in a conventional manner so that air entering the intake 11 is accelerated by the fan 12 to produce two air flows: a first air flow A into the intermediate pressure compressor 13 and a second air flow B which passes through the bypass duct 22 to provide propulsive thrust. The intermediate pressure compressor 13 compresses the air flow A directed into it before delivering that air to the high pressure compressor 14 where further compression takes place.

The compressed air exhausted from the high-pressure compressor 14 is directed into the combustion equipment 15 where it is mixed with fuel and the mixture combusted. The resultant hot combustion products then expand through, and thereby drive the high, intermediate and low-pressure turbines 16, 17, 18 before being exhausted through the nozzle 19 to provide additional propulsive thrust. The high, intermediate and low-pressure turbines 16, 17, 18 respectively drive the high and intermediate pressure compressors 14, 13 and the fan 12 by suitable interconnecting shafts.

The gas turbine engine 10 shown in FIG. 4 shows two rigid dressing rafts 200 according to the present invention. As such, the gas turbine engine 10 is in accordance with the present invention. Each rigid dressing raft 200 may be as described by way of example elsewhere herein.

The lower raft 200 in FIG. 4 comprises at least one electrical conductor 252 embedded in a rigid material 220, which may be a rigid composite material including elongate fibre elements 232 and a matrix material 234, and thus may be referred to as a rigid electrical raft 200. The rigid dressing rafts 200 (which may be referred to simply as rafts) may be used to transmit/transfer electrical signals (or electricity, including electrical power and/or electrical control signals) around the engine and/or to/from the engine 10 from other components, such as components of an airframe.

The upper raft 200 in FIG. 4 has an electrical unit 300 mounted thereon, which may also be part of an electrical system of the gas turbine engine 10. Rigid dressing rafts 200 may additionally or alternatively comprise at least one fluid passage 210 (see FIG. 8, described below) embedded in the rigid material 220. It will be appreciated that in general rigid dressing rafts 200 may comprise any combination of components of an electrical and/or a fluid system embedded therein or mounted thereon.

The rafts 200 are located and attached to the fan case 24 in the example shown in FIG. 4. However, rafts 200 according to the present invention may be provided to any desired location on a gas turbine engine 10.

Figure 5:
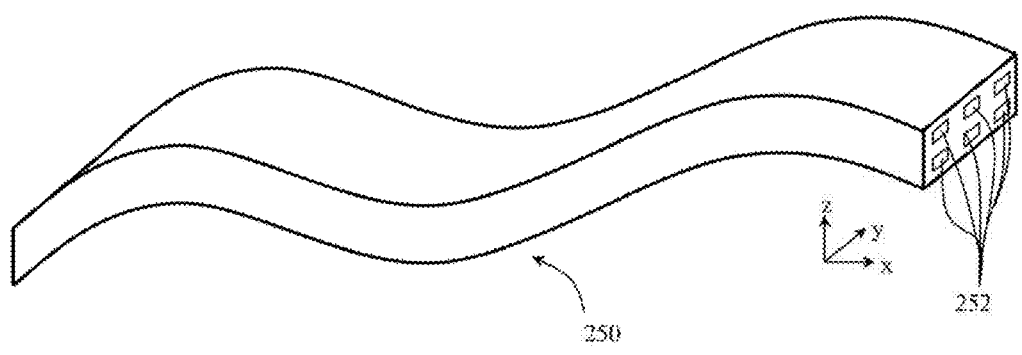
FIG. 5 shows a perspective view of a flexible printed circuit.
Figure 6:
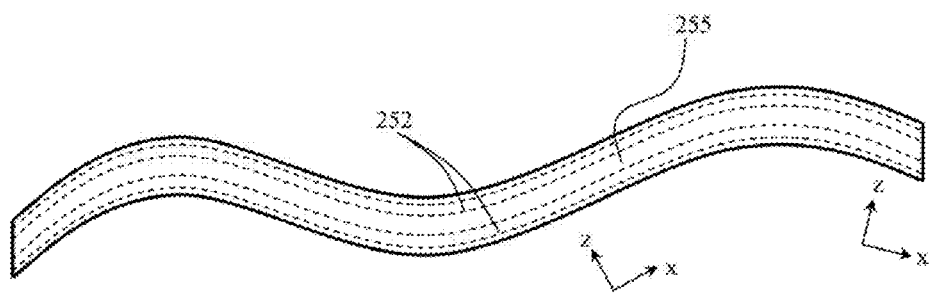
FIG. 6 shows a side view of the flexible printed circuit of FIG. 5.

As mentioned herein, the rigid dressing raft 200 may comprise electrical conductors 252 (for example in the form of electrical wires and/or flexible PCBs) embedded in the rigid material 220. Such a rigid dressing raft may be referred to as a rigid electrical raft 200. An example of an FPC 250 in which the electrical conductors 252 may be provided is shown in greater detail in FIGS. 5 and 6. FIG. 5 shows a perspective view of the FPC 250, and FIG. 6 shows a side view. Power may be supplied to the elongate fibre element 232 using one or more of the conductors 252 embedded in an FPC 250.

Such an FPC 250 may comprise a flexible (for example elastically deformable) substrate 255 with conductive tracks 252 laid/formed therein. The FPC 250 may thus be deformable. The FPC 250 may be described as a thin, elongate member and/or as a sheet-like member. Such a thin, elongate member may have a major surface defined by a length and a width, and a thickness normal to the major surface. In the example shown in FIGS. 5 and 6, the FPC 250 may extend along a length in the x-direction, a width in the y-direction, and a thickness (or depth or height) in the z-direction. The x-direction may be defined as the axial direction of the FPC. Thus, the x-direction (and thus the z-direction) may change along the length of the FPC 250 as the FPC is deformed. This is illustrated in FIG. 5. The x-y surface(s) (i.e. the surfaces formed by the x and y directions) may be said to be the major surface(s) of the FPC 250. In the example shown in FIGS. 5 and 6, the FPC 250 is deformable at least in the z direction, i.e. in a direction perpendicular to the major surface. FPCs may be additionally of alternatively deformable about any other direction, and/or may be twisted about any one or more of the x, y, or z directions.

The flexible substrate 255 may be a dielectric. The substrate material may be, by way of example only, polyamide. As will be readily apparent, other suitable substrate material could alternatively be used.

The conductive tracks 252, which may be surrounded by the substrate 255, may be formed using any suitable conductive material, such as, by way of example only, copper, copper alloy, tin-plated copper (or tin-plated copper alloy), silver-plated copper (or silver-plated copper alloy), nickel-plated copper (or nickel-plated copper alloy) although other materials could alternatively be used. The conductive tracks 252 may be used to conduct/transfer electrical signals (including electrical power and electrical control signals) through the rigid raft assembly (or assemblies) 200, for example around a gas turbine engine 10 and/or to/from components of a gas turbine engine and/or an airframe attached to a gas turbine engine.

The size (for example the cross-sectional area) and/or the shape of the conductive tracks 252 may depend on the signal(s) to be transmitted through the particular conductive track 252. Thus, the shape and/or size of the individual conductive tracks 252 may or may not be uniform in a FPC 250.

The example shown in FIGS. 5 and 6 has 6 conductive tracks 252 running through the substrate 255. However, the number of conductive tracks 252 running through a substrate 255 could be fewer than 6, or greater than 6, for example tens or hundreds of tracks, as required. As such, many electrical signals and/or power transmission lines may be incorporated into a single FPC 250.

A single FPC 250 may comprise one layer of tracks, or more than one layer of tracks, for example, 2, 3, 4, 5, 6, 7, 8, 9, 10 or more than 10 layers of tracks. An FPC may comprise significantly more than 10 layers of tracks, for example at least an order of magnitude more layers of tracks. In this regard, a layer of tracks may be defined as being a series of tracks that extend in the same x-y surface. Thus, the example shown in FIGS. 5 and 6 comprises 2 layers of tracks, with each layer comprising 3 tracks 252.

A rigid dressing raft 200 as described and claimed herein may be manufactured using any suitable method. For example, the rigid material 220 may initially be provided as layers of flexible material, such as (by way of example only) layers of fibre and resin compound. This flexible material may be placed into a mould, for example having a desired shape. Other components (such as fluid pipes 210 and/or electrical conductors 252, which may be embedded in a FPC 250) may also be placed into the mould, for example between layers of the flexible material from which the rigid material 220 is ultimately formed. Parts of the mould may have any suitable form and/or construction, for example that could be readily removed when the raft 200 is formed into the desired shape.

Figure 7:
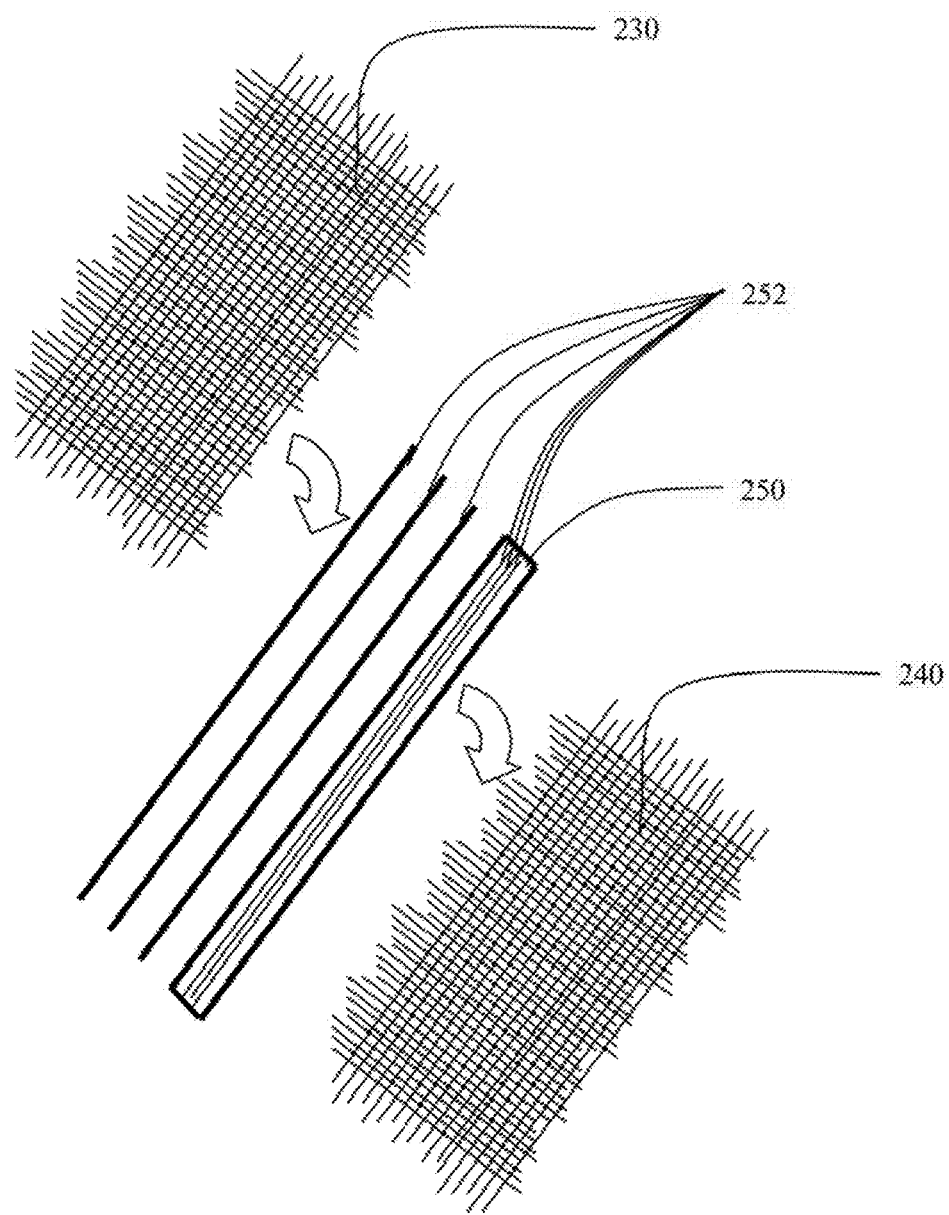
FIG. 7 shows a schematic of an electrical raft prior to assembly.

FIG. 7 shows components of an example of an electrical raft 200 prior to one method of construction. The electrical conductors 252 are provided between two layers of material 230, 240 that, after construction, form the rigid material 220. Some of the electrical conductors 252 are provided in an FPC 250. The material 230, 240 may be a fibre and resin compound, as described elsewhere herein, and may include the elongate fibre element(s) used to monitor the raft. Such a fibre and resin compound may, after suitable treatment (for example heat treatment), produce the rigid composite material 220. In the example of FIG. 7, the fibre and resin compound is formed of a sheet of interwoven fibres, or strands. The strands in FIG. 7 extend in perpendicular directions, although the strands may extend in any one or more directions as required. The strands/fibres may be pre-impregnated (or "pre-pregged") with the resin. At least one of the strands may be the electrically conductive elongate fibre element.

The method of construction illustrated and described in relation to FIG. 7 could be used for any rigid dressing raft 200. For example, fluid pipes 210 may be laid between the pre-pregged sheets in addition to or instead of the electrical conductors 252.

Prior to any treatment, both the first and second layers 230, 240 and the electrical conductors 252 (or other embedded components) may be flexible, for example supple, pliable or malleable. As such, when the layers 230, 240 and the electrical conductors 252 are placed together, they may be moulded, or formed, into any desired shape. For example, the layers 230, 240 and the electrical conductors 252 may be placed into a mould (which may be of any suitable form, such as a glass or an aluminium mould) having the desired shape. The desired shape may be, for example, a shape that corresponds to (for example is offset from) a part of a gas turbine engine, such as, by way of example only, at least a part of a casing, such as an engine fan casing or engine core casing. This may enable the final raft to adopt shapes that are curved in two-dimensions or three-dimensions, and/or to include the location fixings 400.

Any suitable method could be used to produce the raft 200. For example, the strands/fibres need not be pre-impregnated with the resin. Instead, the fibres/strands could be put into position in a dry state, and then the resin could be fed (or pumped) into the mould, for example around any embedded components. Such a process may be referred to as a resin transfer method.

Figure 8:
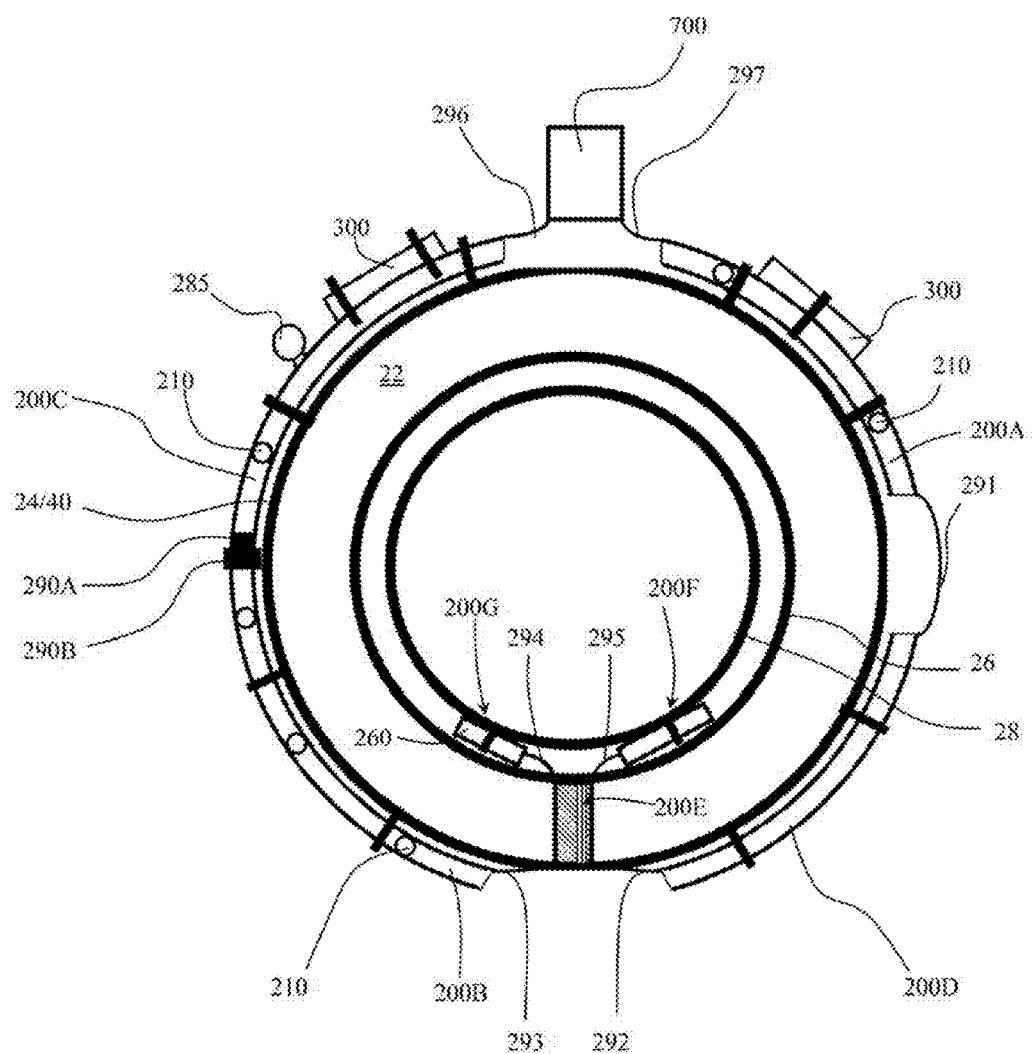
FIG. 8 shows a cross-section normal to the axial direction through a gas turbine engine according to an embodiment of the invention.

FIG. 8 is a schematic showing a cross-section perpendicular to the direction X-X of a gas turbine engine comprising rigid dressing rafts 200A-200G. Any one or more of the rigid dressing rafts 200 may comprise an elongate fibre element 232 for use with a circuit 400 for monitoring one or more properties of the raft 200.

The rigid dressing rafts 200A-200D are mounted to a fan case 24, the raft 200E is mounted within a bifurcation splitter that radially crosses a bypass duct 22, and the rafts 200F, 200G are mounted to an engine core case 28. However, it will be appreciated that a rigid dressing raft 200 could be mounted in any suitable and/or desired location on a gas turbine engine 10.

In FIG. 8, two rafts 200A, 200C are shown as having an electrical unit 300 mounted thereon. However, any (or none) of the rafts 200 may have an electrical unit 300 mounted thereon.

As mentioned herein, each of the rafts 200 shown in FIG. 8 may comprise one or more electrical conductors 252 embedded therein. However, any one or more of the rigid dressing rafts 200 may not comprise electrical conductors 252 in addition to the at least one electrically conductive elongate fibre element. Such a raft may have other components/systems (such as, by way of example only, fluid systems, such as pipes) mounted thereon and/or embedded therein. Thus, for example, a gas turbine engine in accordance with the present invention may comprise an electrical raft 200 and/or a non-electrical raft 200.

At least one of the rafts 200A-200G may be replaced with a raft that does not comprise an elongate fibre element 232 used for monitoring the raft 200. The arrangement of rafts 200A-200G shown in FIG. 8 is by way of example only. Alternative arrangements, for example in terms of number, size, shape and/or positioning, of rafts 200A-200G may be used. For example, there need not be 7 rafts 200, the rafts 200 may or may not be connected together, and the rafts 200 could be provided to (for example mounted on) any one or more components of the gas turbine engine. Purely by way of example only, connection between rafts 200A-200D mounted on the fan casing 24 to the rafts 200F, 200G mounted on the core casing 28 may be provided at least in part by means other than an additional raft 200E, for example using wire conductors with insulating sleeves. By way of further example, one or more rafts 200 may additionally or alternatively be provided to the nose cone, structural frames or elements within the engine (such as "A-frames"), the nacelle, the fan cowl doors, and/or any connector or mount between the gas turbine engine 10 and a connected structure (which may be at least a part of a structure in which the gas turbine engine 10 is installed), such as the pylon 500 between the gas turbine engine 10 and an airframe (not shown).

Any one or more of the rigid dressing rafts 200 may have a fluid passage 210 embedded therein and/or provided thereto. The fluid passage 210 may be part of a fluid system, such as a gas (for example pneumatic or cooling gas/air) and/or liquid (for example a fuel, hydraulic and/or lubricant liquid). In the FIG. 8 example, three of the rafts 200A, 200B, 200C comprise a fluid passage 210 at least partially embedded therein. The raft 200C also has a fluid passage 285 (which may be for any fluid, such as those listed above in relation to embedded passage 210) mounted thereon. Such a mounted fluid passage 285 may be provided to any raft, such as those shown in FIG. 8. The fluid passages 210, 285 shown in FIG. 8 may be oriented in an axial direction of the engine 10. However, fluid passages may be oriented in any direction, for example axial, radial, circumferential or a combination thereof.

Any of the rafts 200A-200G may have any combination of mechanical, electrical and/or fluid connections to one or more (for example 2, 3, 4, 5 or more than 5) other components/systems of the gas turbine engine 10 and/or the rest of the gas turbine engine 10. Examples of such connections are shown in FIG. 8, and described below, but other connectors may be used. For example, rafts 200 may be connected together (or to other components) using any combination of electrical, fluid and/or mechanical connectors. Thus, any of the electrical connections 290A/290B, 291-297 shown in FIG. 8 may be any combination of electrical, fluid and/or mechanical connection. Alternatively, rafts 200 may be standalone, and thus may have no connection to other rafts or components.

A connection 291 is shown between the rafts of the rafts 200A and 200D. The connection 291 may comprise an electrical connection. Such an electrical connection may be flexible and may, for example, take the form of a flexible printed circuit such as the flexible printed circuit 250 shown in FIGS. 5 and 6. Such a flexible electrical connection may be used to electrically connect any raft 200 that is an electrical raft 200 to any other component, such as another electrical raft 200. A connection 297 (which may be or comprise an electrical connection) is provided between the electrical raft 200A and a part of an airframe, or airframe installation 700, which may, for example, be a pylon. Similarly, a fluid and/or mechanical connection 296 may additionally or alternatively be provided between the airframe 700 and another raft 200C. As shown in FIG. 8, other electrical and/or fluid connections 292, 293, 294, 295 may be provided between rafts 200 and other components, such as other rafts 200.

A direct connection 290A, 290B may be provided, as shown for example between the rafts 200B and 200C in the FIG. 8 arrangement. Such a direct connection 290A, 290B may comprise a connector 290A provided on (for example embedded in) one raft 200 connected to a complimentary connector 290B provided on (for example embedded in) another raft 200. Such a direct connection 290A, 290B may, for example, provide fluid and/or electrical connection between the two rafts 200B, 200C.

Where reference is made herein to a gas turbine engine, it will be appreciated that this term may include a gas turbine engine/gas turbine engine installation and optionally any peripheral components to which the gas turbine engine may be connected to or interact with and/or any connections/ interfaces with surrounding components, which may include, for example, an airframe and/or components thereof. Such connections with an airframe, which are encompassed by the term 'gas turbine engine' as used herein, include, but are not limited to, pylons and mountings and their respective connections. The gas turbine engine itself may be any type of gas turbine engine, including, but not limited to, a turbofan (bypass) gas turbine engine, turbojet, turboprop, ramjet, scramjet or open rotor gas turbine engine, and for any application, for example aircraft, industrial, and marine application. Rigid dressing rafts 200 such as any of those described and/or claimed herein may be used as part of any apparatus, such as any vehicle, including land, sea, air and space vehicles, such as motor vehicles (including cars and busses), trains, boats, submarines, aircraft (including aeroplanes and helicopters) and spacecraft (including satellites and launch vehicles).

It will be appreciated that many alternative configurations and/or arrangements of rigid dressing rafts 200 and gas turbine engines 10 comprising rigid dressing rafts 200 other than those described herein may fall within the scope of the invention. For example, alternative arrangements of rafts 200 (for example in terms of the arrangement/shape/positioning/construction of the rafts 200, the type and/or positioning of components (if any) mounted to/embedded in the rafts 200, the rigid material 220, the elongate fibre element 232 and any electrical conductors 252) may fall within the scope of the invention and may be readily apparent to the skilled person from the disclosure provided herein. Alternative arrangements of connections (for example mechanical, electrical and/or fluid) between the rafts and between the rafts and other components may fall within the scope of the invention and may be readily apparent to the skilled person from the disclosure provided herein. Furthermore, any feature described and/or claimed herein may be combined with any other compatible feature described in relation to the same or another embodiment.

I claim:

1. A raft monitoring system for a vehicle, comprising:
a rigid dressing raft including:
a rigid material;
at least a part of a component or system of the vehicle provided to the rigid material; and
at least one electrically conductive elongate fibre element that is integral to the rigid material,
the raft monitoring system further comprising an electrical measurement circuit electrically connected to the elongate fibre element so as to supply an electrical current thereto, and configured to determine a resistance of the elongate fibre element, the determined resistance being representative of at least one property of the rigid dressing raft.

2. A raft monitoring system according to claim 1, wherein the conductive elongate fibre element comprises carbon.

3. A raft monitoring system according to claim 1, wherein:
the rigid material is a carbon fibre composite material; and
each at least one electrically conductive elongate fibre element is one or more carbon fibre strands.

4. A raft monitoring system according to claim 1, wherein each at least one electrically conductive elongate fibre element is a carbon nano-tube.

5. A raft monitoring system according to claim 1 comprising a metallic conductor permanently embedded so as to be surrounded by and integrated into the rigid material, wherein:
the metallic conductor is connected to the elongate fibre element and connected to the electrical measurement circuit.

6. A raft monitoring system according to claim 5, wherein a component or system provided to the rigid material is an electrical system, and the embedded metallic conductor is one of a plurality of embedded metallic conductors that form at least a part of the electrical system.

7. A raft monitoring system according to claim 6, wherein at least one embedded conductor is provided in the form of a flexible printed circuit.

8. A raft monitoring system according to claim 5, wherein at least one embedded conductor is provided in the form of a flexible printed circuit.

9. A raft monitoring system according to claim 1, wherein a component or system provided to the rigid material is a fluid system which comprises at least one fluid passage at least partially embedded in the rigid material.

10. A raft monitoring system according to claim 1, wherein:
the electrical measurement circuit comprises a wheatstone bridge arrangement; and
the elongate fibre element forms an unknown resistor element (Rx) to be determined by the wheatstone bridge arrangement.

11. A raft monitoring system according to claim 1, further comprising:
a raft parameter determination system arranged to determine a value of a parameter of the rigid dressing raft from the determined resistance of the elongate fibre element.

12. A raft monitoring system according to claim 11, wherein
the raft parameter determination system is arranged to determine a value of at least one of the temperature, stress and vibration level of the rigid dressing raft.

13. A raft monitoring system according to claim 11, further comprising an additional system for determining at least one parameter of the vehicle.

14. A raft monitoring system according to claim 1, wherein
the electrical measurement circuit is part of the rigid dressing raft.

15. A gas turbine engine comprising a raft monitoring system according to claim 1, wherein
the rigid material of the rigid dressing raft is shaped to conform to a part of the gas turbine engine.

16. A method of measuring a parameter of a rigid dressing raft, the method comprising:
providing a rigid dressing raft, the rigid dressing raft having a rigid material, at least a part of a component or system provided to the rigid material, and at least one electrically conductive elongate fibre element that is integral to the rigid material;
passing an electrical current through the electrically conductive elongate fibre element so as to thereby measure its resistance; and
using the measured resistance to determine the value of a parameter of the rigid dressing raft.

* * * * *